(12) United States Patent
Huang et al.

(10) Patent No.: US 8,872,202 B2
(45) Date of Patent: Oct. 28, 2014

(54) LIGHT-EMITTING DEVICE CAPABLE OF IMPROVING THE LIGHT-EMITTING EFFICIENCY

(71) Applicants: Yi-Ru Huang, Tainan (TW); Jing-En Huang, Tainan (TW); Chih-Ling Wu, Tainan (TW); Yu-Yun Lo, Tainan (TW)

(72) Inventors: Yi-Ru Huang, Tainan (TW); Jing-En Huang, Tainan (TW); Chih-Ling Wu, Tainan (TW); Yu-Yun Lo, Tainan (TW)

(73) Assignee: Genesis Photonics Inc., Tainan (TW)

( * ) Notice: Subject to any disclaimer, the term of this patent is extended or adjusted under 35 U.S.C. 154(b) by 0 days.

(21) Appl. No.: 13/917,646

(22) Filed: Jun. 14, 2013

(65) Prior Publication Data

US 2014/0159082 A1 Jun. 12, 2014

(30) Foreign Application Priority Data

Dec. 6, 2012 (TW) .............................. 101145826 A

(51) Int. Cl.
*H01L 33/22* (2010.01)
(52) U.S. Cl.
CPC ...................................... *H01L 33/22* (2013.01)
USPC ........................................................... 257/95

(58) Field of Classification Search
CPC ......... H01L 33/22; H01L 33/42; H01L 33/58; H01L 2933/0091; H01L 2933/0083; H01L 2933/0058; H01L 51/5268; H01L 51/5262; H01L 51/5281
USPC ........................................................... 257/95
See application file for complete search history.

(56) References Cited

U.S. PATENT DOCUMENTS

| | | | |
|---|---|---|---|
| 2003/0047745 A1* | 3/2003 | Suzuki et al. ................. | 257/103 |
| 2004/0026700 A1* | 2/2004 | Akaike et al. .................... | 257/79 |
| 2006/0145171 A1* | 7/2006 | Nitta et al. ....................... | 257/95 |
| 2012/0319149 A1* | 12/2012 | Su et al. ........................... | 257/98 |

* cited by examiner

*Primary Examiner* — Benjamin Sandvik
*Assistant Examiner* — Farid Khan
(74) *Attorney, Agent, or Firm* — Jianq Chyun IP Office

(57) ABSTRACT

A light-emitting device including a substrate, a light emitting structure and a coarse structure is provided. The substrate has an upper surface and a lower surface opposite to each other, and an annular side surface connecting the upper surface and the lower surface. The light emitting structure is disposed on the upper surface of the substrate. The coarse structure is formed on the annular side surface of the substrate. A ratio of a thickness of the substrate and a thickness of the coarse structure is greater than or equal to 1 and less than or equal to 20. Therefore, the overall light-emitting efficiency of the light-emitting device may be improved.

11 Claims, 6 Drawing Sheets

LIGHT-EMITTING DEVICE CAPABLE OF IMPROVING THE LIGHT-EMITTING EFFICIENCY

CROSS-REFERENCE TO RELATED APPLICATION

This application claims the priority benefit of Taiwan application Ser. No. 101145826, filed on Dec. 6, 2012. The entirety of the above-mentioned patent application is hereby incorporated by reference herein and made a part of this specification.

BACKGROUND OF THE INVENTION

1. Field of the Invention

The invention relates to a light-emitting device, and more particularly relates to a light-emitting device capable of improving the light-emitting efficiency.

2. Description of Related Art

In general, a light-emitting diode wafer usually is fabricated by following steps: providing a substrate, forming an epitaxial structure on the substrate by epitaxial growth, and then disposing electrodes on the epitaxial structure to provide electric power, so that the light-emitting diode wafer may emit light by photoelectric effect. Thereafter, a plurality of scribe lines crisscrossing to each other is formed on the epitaxial structure by photolithography technique. Further, two adjacent scribe lines in vertical direction and two adjacent scribe lines in horizontal direction collectively define a light-emitting diode die. Thereafter, back-end processes (polishing and dicing) are performed to divide the light-emitting diode wafer into a plurality of light-emitting diode dices, thereby finishing the fabrication of a light-emitting diode.

Since sidewalls of the light-emitting diode obtained by applying conventional dicing technique are in planar shape, and there is a difference between the refractive index of the material of the light-emitting diode and the refractive index of air, most of light emitted at the side surfaces of the light-emitting diode would be totally reflected, and only a small portion of light emitted from the light-emitting diode can pass through the side surfaces of the light-emitting diode. Consequently, the light emitted at the side surfaces of the light-emitting diode cannot be effectively utilized, thereby affecting the light emitting efficiency at the side surfaces of the light-emitting diode and reducing the light-emitting brightness of the light-emitting diode. Therefore, improving the light-emitting amount at the side surfaces of the light-emitting diode to enhance the overall light-emitting efficiency has to be resolved.

SUMMARY OF THE INVENTION

The invention provides a light-emitting device, including a coarse structure formed on a annular side surface of a substrate, and capable of improving the light-emitting efficiency.

The invention provides a light-emitting device including a substrate, a light emitting structure and a coarse structure. The substrate has an upper surface and a lower surface opposite to each other, and an annular side surface connecting the upper surface and the lower surface. The light emitting structure is disposed on the upper surface of the substrate. The coarse structure is formed on the annular side surface of the substrate. A ratio of a thickness of the substrate and a thickness of the coarse structure is greater than or equal to 1 and less than or equal to 20.

In an embodiment of the invention, the ratio of the thickness of the substrate and the thickness of the coarse structure is greater than or equal to 3 and less than or equal to 10.

In an embodiment of the invention, the thickness of the coarse structure is greater than or equal to 10 μm and less than or equal to 50 μm.

In an embodiment of the invention, a distance from a side of the coarse structure relatively near the upper surface of the substrate to the upper surface of the substrate is greater than or equal to 10 μm and less than or equal to 150 μm.

In an embodiment of the invention, a distance from a side of the coarse structure relatively near the lower surface of the substrate to the lower surface of the substrate is greater than or equal to 0 μm and less than or equal to 100 μm.

In an embodiment of the invention, the coarse structure includes an annular coarse structure.

In an embodiment of the invention, the annular coarse structure includes an annular continuous coarse structure.

In an embodiment of the invention, the coarse structure includes a plurality of annular coarse structures.

In an embodiment of the invention, the annular coarse structures are formed on the annular side surface of the substrate in different spacings.

In an embodiment of the invention, a portion of the annular coarse structures overlap with each other.

In an embodiment of the invention, the coarse structure is formed by a non-periodic pattern.

In an embodiment of the invention, the light-emitting device is a flip chip light-emitting device.

In an embodiment of the invention, the light emitting structure includes a first electrode, a second electrode, a first type semiconductor layer, a second type semiconductor layer and a light-emitting layer. The light-emitting layer is located between the first type semiconductor layer and the second type semiconductor layer, and the first electrode and the second electrode are respectively disposed on the first type semiconductor layer and the second type semiconductor layer.

Based on the above, since the light-emitting device of the invention includes the coarse structure, light can be scattered by the coarse structure when the light emitted from the light emitting structure. Therefore, the total reflection of the light emitted at the side surfaces of the light-emitting device may be prevented, thereby improving the overall light emitting efficiency of the light-emitting device.

Several exemplary embodiments accompanied with figures are described in detail below to further describe the disclosure in details.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the disclosure.

DESCRIPTION OF EMBODIMENTS

Figure 1:
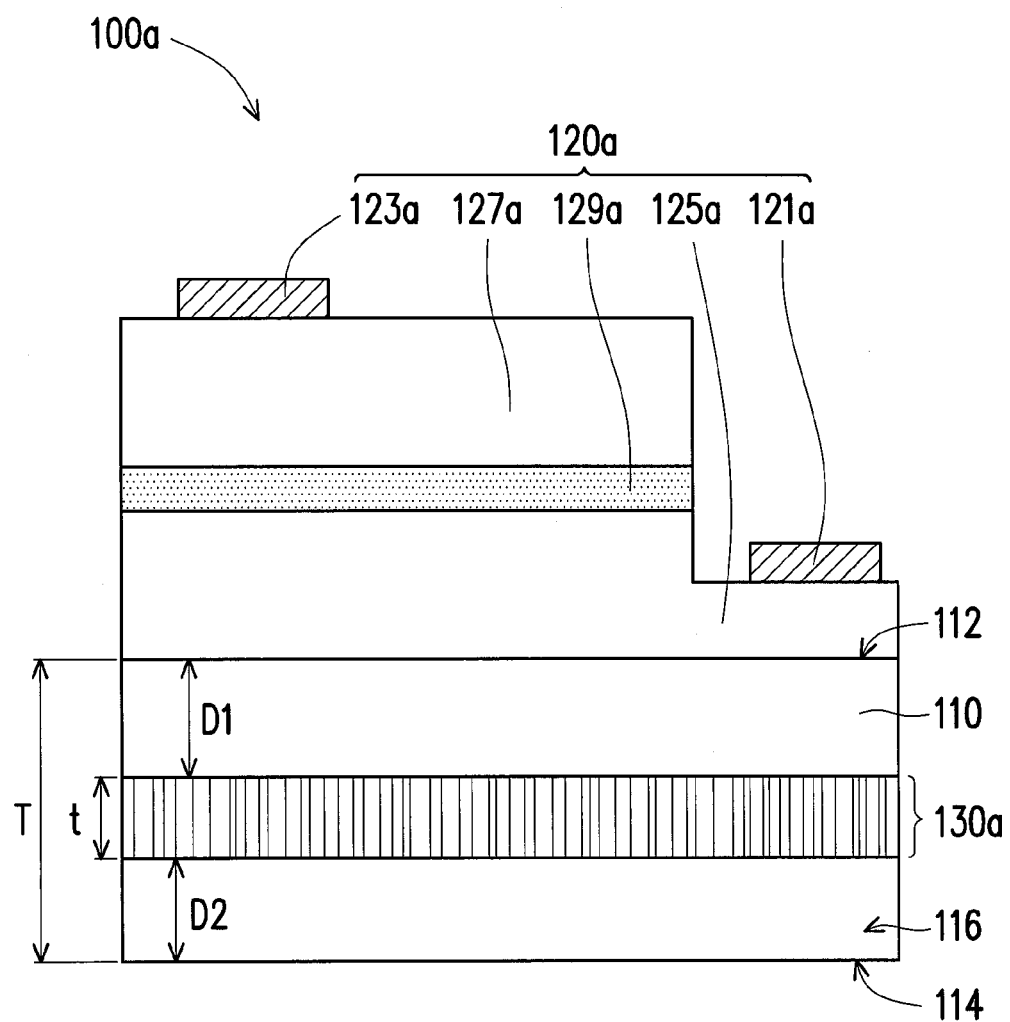
FIG. 1 is a schematic view of a light-emitting device according to an embodiment of the invention.

FIG. 1 is a schematic view of a light-emitting device according to an embodiment of the invention. Referring to FIG. 1, in the embodiment, the light-emitting device 100a includes a substrate 110, a light emitting structure 120a and a coarse structure 130a. The substrate 110 has an upper surface 112 and a lower surface 114 opposite to each other and an annular side surface 116 connecting the upper surface 112 and the lower surface 114. The light emitting structure 120a is disposed on the upper surface 112 of the substrate 110. The coarse structure 130a is formed on the annular side surface 116 of the substrate 110. In particular, a ratio of a thickness T of the substrate 110 and a thickness t of the coarse structure 130a is, for example, greater than or equal to 1 and less than or equal to 20.

More particularly, the light emitting structure 120a is formed by a first electrode 121a, a second electrode 123a, a first type semiconductor layer 125a, a second type semiconductor layer 127a and a light-emitting layer 129a, for example, to generate light. Here, the first type semiconductor layer 125a, the light-emitting layer 129a and the second type semiconductor layer 127a are sequentially formed on the upper surface 112 of the substrate 110 by epitaxial growth, for example. The material of each of the first type semiconductor layer 125a, the second type semiconductor layer 127a and the light-emitting layer 129a is selected from the group consisting of aluminum gallium indium phosphide (AlGaInP), aluminum nitride (AlN), gallium nitride (GaN), aluminium gallium nitride (AlGaN), indium gallium nitride (InGaN), aluminum indium gallium nitride (AlInGaN) and combinations thereof, for example. The material of each of the first electrode 121a and the second electrode 123a is, for example, conductive material, such as metal or metal alloy. The first electrode 121a and the second electrode 123a are respectively disposed on the first type semiconductor layer 125a and the second type semiconductor layer 127a. For increasing the light emitting efficiency, it is necessary to prevent the light emitted from the light-emitting layer 129a of the light emitting structure 120a from being absorbed by the substrate 110. Therefore, the material of the substrate 110 of this embodiment is, for example, a transparent material, wherein the transparent material is selected from the group consisting of sapphire, silicon carbide (SiC), silicon (Si), gallium arsenide (GaAs), zinc oxide (ZnO) and a hexagonal crystalline material. In particular, the coarse structure 130a is formed on the annular side surface 116 of the substrate 110 by stealth dicing process, for example, to scatter the light emitted from the light-emitting layer 129a. Preferably, the ratio of the thickness T of the substrate 110 and the thickness t of the coarse structure 130a is greater than or equal to 3 and less than or equal to 10. Here, the thickness t of the coarse structure 130a is, for example, greater than or equal to 10 μm and less than or equal to 50 μm. In addition, a distance D1 from a side of the coarse structure 130a relatively near the upper surface 112 of the substrate 110 to the upper surface 112 of the substrate 110 is, for example, greater than or equal to 10 μm and less than or equal to 150 μm, and a distance D2 from a side of the coarse structure 130a relatively near the lower surface 114 of the substrate 110 to the lower surface 114 of the substrate 110 is, for example, greater than or equal to 0 μm and less than or equal to 100 μm.

Further, the coarse structure 130a in this embodiment is, for example, an annular coarse structure, wherein the annular coarse structure may be an annular continuous coarse structure. Of course, in other embodiments, the coarse structure may also be other types of structures. Here, it is noted that the below-described embodiments employ the reference numerals of the above-described embodiment and shares some common features therewith, and the same reference numerals denote the same or similar elements, so that the relevant descriptions thereof may be omitted hereinafter. The omitted descriptions can be found in the above-described embodiment, and detailed descriptions will not be reiterated hereinafter.

Figure 2A:
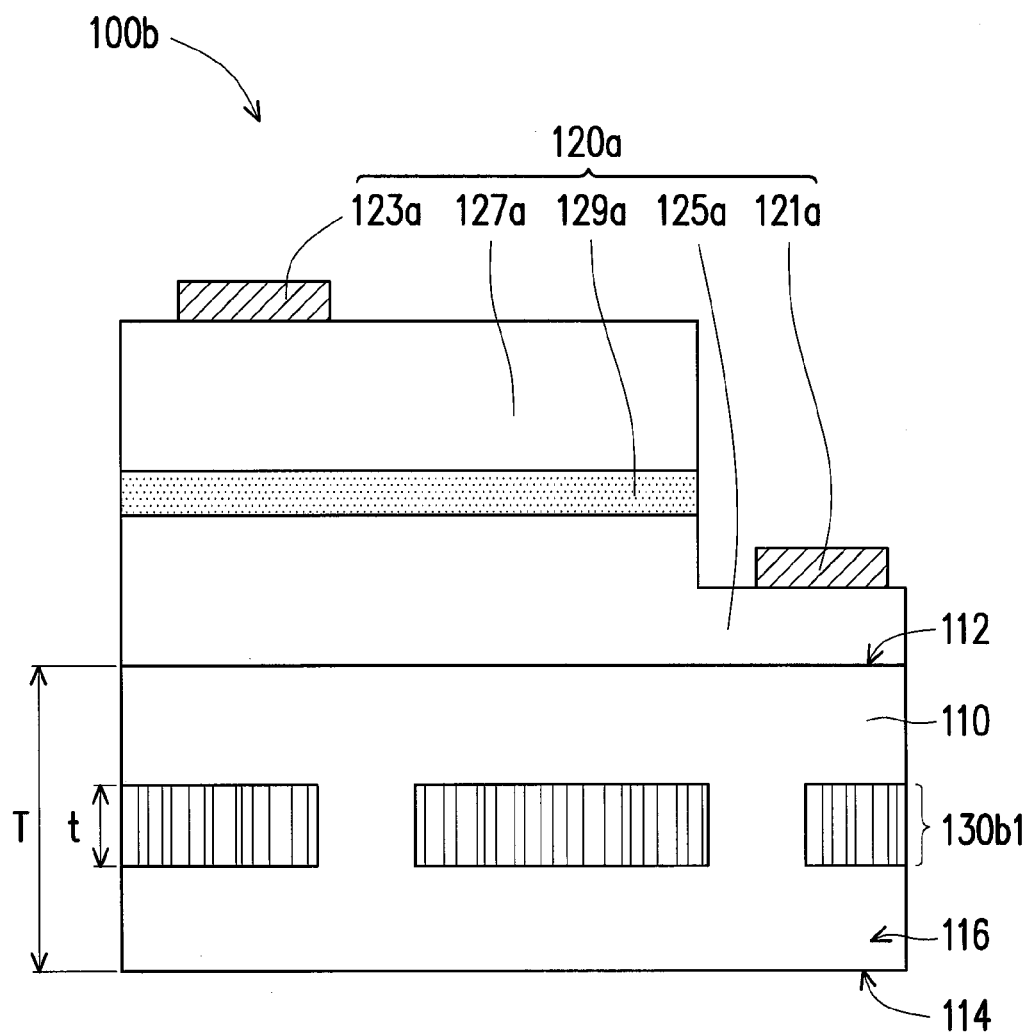
FIG. 2A is a schematic view of a light-emitting device according to another embodiment of the invention.
Figure 2B:
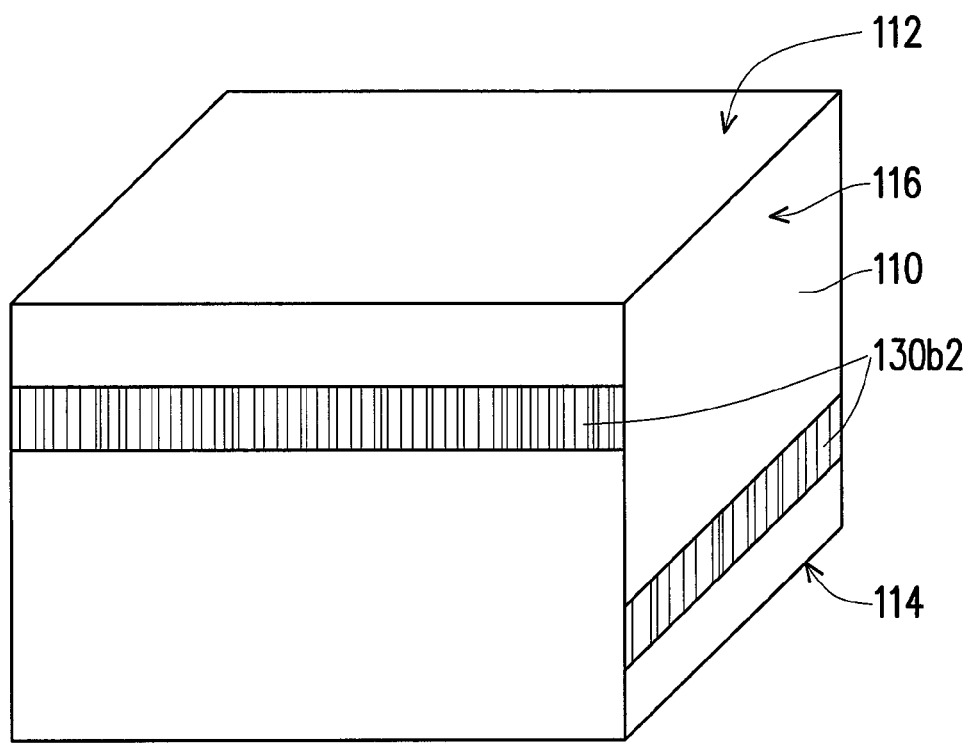
FIG. 2B is a schematic view illustrating relative arrangement of a substrate and a coarse structure according to an embodiment of the invention.

Referring to FIG. 2A, a coarse structure 130b1 of a light-emitting device 100b may also be an annular discontinuous coarse structure. Alternatively, referring to FIG. 2B, a relative arrangement of a substrate and a coarse structure according to an embodiment of the invention is illustrated. For the convenience of illustration, the substrate 110 of FIG. 2B is shown as three-dimensional structure, and a coarse structure 130b2 is an annular discontinuous coarse structure in a different horizontal plane. In particular, the coarse structure 130a, the coarse structure 130b1 and the coarse structure 130b2 are, for example, formed by a non-periodic pattern and the non-periodic pattern is, for example, a strip-shaped pattern. Of course, in other embodiments which are not illustrated, the coarse structure 130a, the coarse structure 130b1 and the coarse structure 130b2 may also be formed by a periodic pattern, and the periodic pattern is, for example, a sine-wave pattern, a sawtooth-wave pattern or a square-wave pattern.

Figure 3:
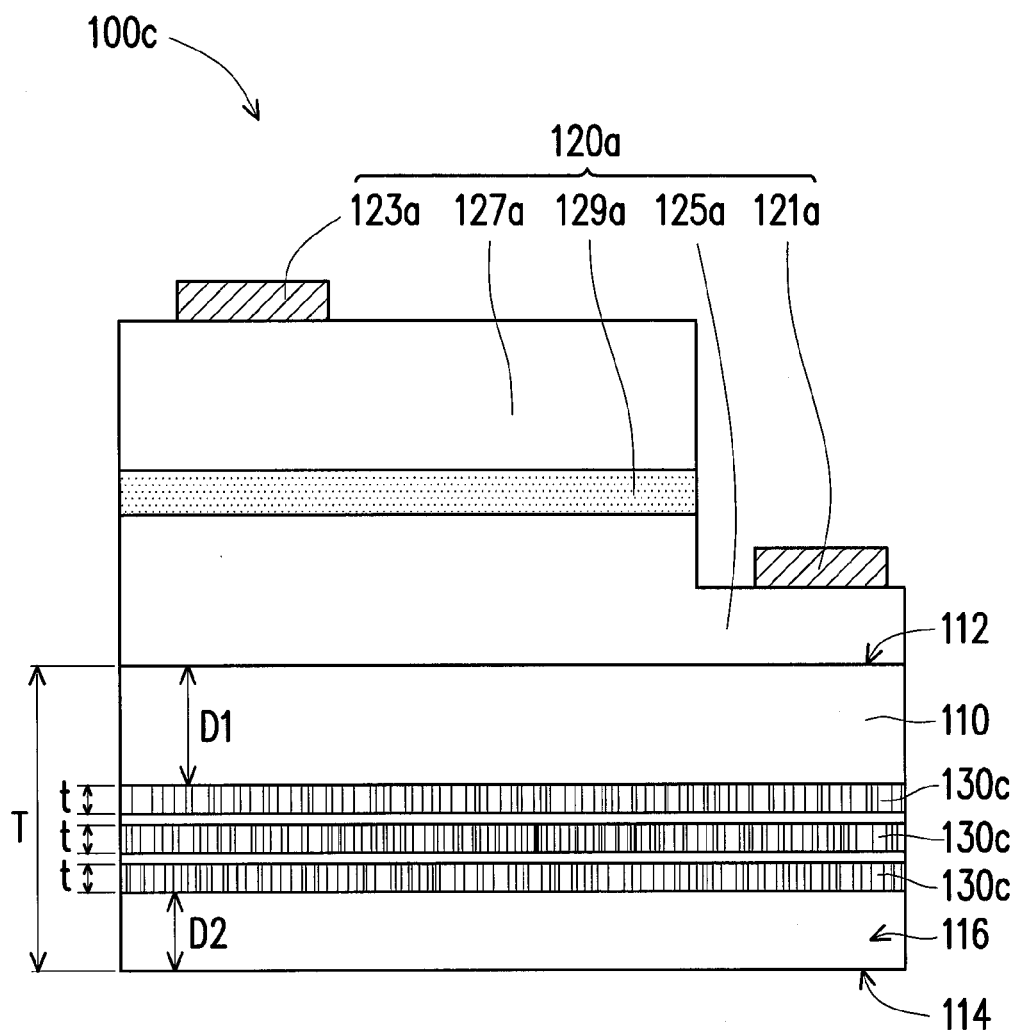
FIG. 3 is a schematic view of a light-emitting device according to still another embodiment of the invention.

Moreover, referring to FIG. 3, a coarse structure of a light-emitting device 100c may also include a plurality of annular coarse structures 130c, wherein the annular coarse structures 130c are formed by the non-periodic pattern, and are the annular continuous coarse structure. Of course, in other embodiments which are not illustrated, the annular coarse structures 130c may also be the annular discontinuous coarse structure. Further, the annular coarse structures 130c are formed on the annular side surface 116 of the substrate 110 at equal spacings, i.e. the annular coarse structures 130c do not overlap with each other. It is noted that the thickness t of each annular coarse structure 130c is illustrated to be identical with every other one in FIG. 3, but the thickness t substantially is a value with a specific range, i.e. a value is greater than or equal to 10 μm and less than or equal to 50 μm. Therefore, the thicknesses t of two adjacent annular coarse structures 130c may be or may not be the same.

Figure 4:
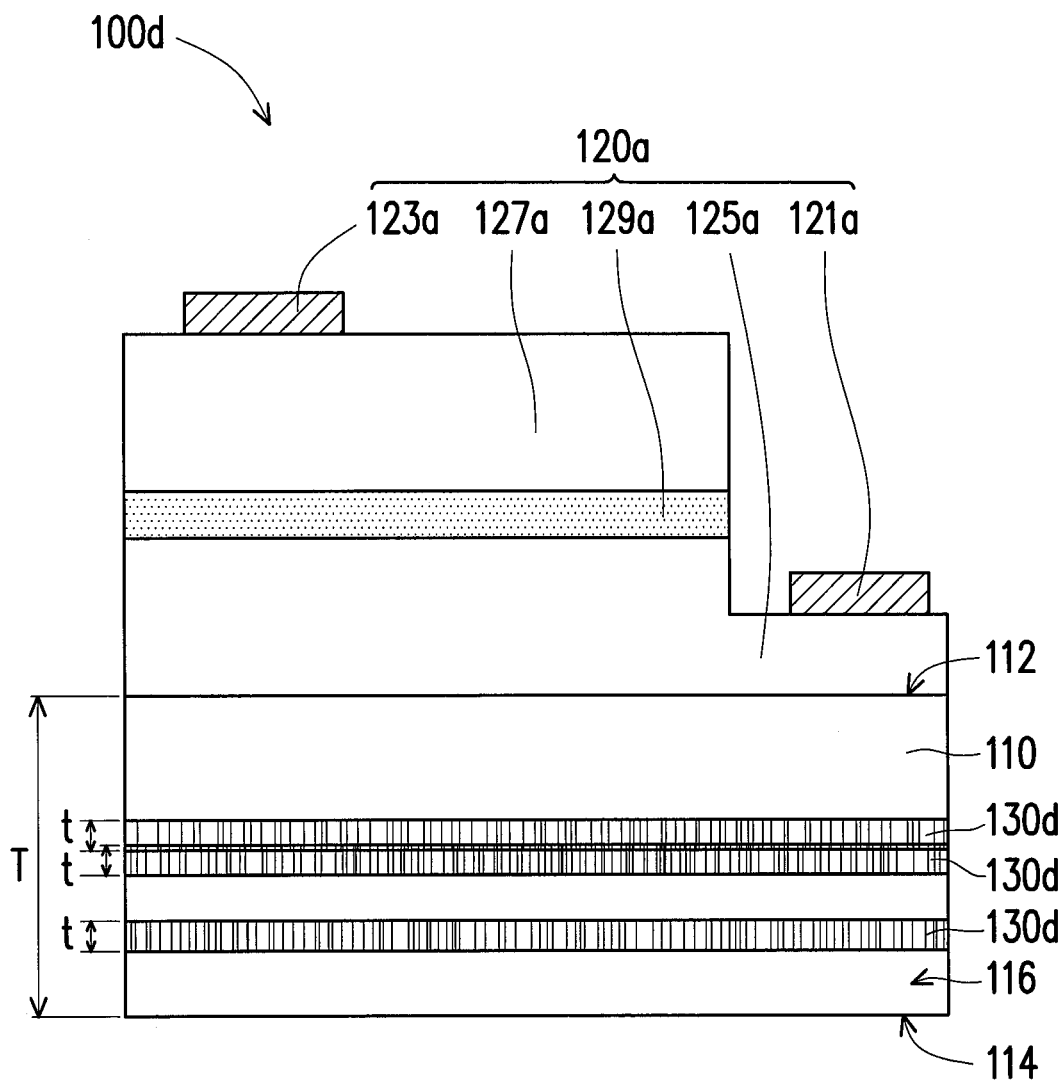
FIG. 4 is a schematic view of a light-emitting device according to yet another embodiment of the invention.

Alternatively, referring to FIG. 4, annular coarse structures 130d of a light-emitting device 100d may also be formed on the annular side surface 116 of the substrate 110 in different spacings, and thus there may be a case that the annular coarse structures 130d totally overlap with each other, a portion of the annular coarse structures 130d overlap with each other or the annular coarse structures 130d do not overlap with each other. As shown in FIG. 4, a portion of the annular coarse structures 130d overlap with each other while another portion of the annular coarse structures 130d totally do not overlap, and the thicknesses t of two adjacent annular coarse structures 130d may be or may not be the same.

Moreover, in other embodiments which are not illustrated, persons skilled in the art can adjust or change the structure design of the coarse structure depending on actual requirement with reference to the descriptions of the above-described embodiments to achieve the desired technical effects, and thus details thereof are not described herein.

Since the coarse structure 130a, the coarse structure 130b1 and the coarse structure 130b2 or the annular coarse structures 130c and the annular coarse structures 130d are formed on the annular side surface 116 of the substrate 110 in the embodiments, light can be scattered by the coarse structure 130a, the coarse structure 130b1 and the coarse structure 130b2 or the annular coarse structures 130c and the annular coarse structures 130d when the light emitted from the light-emitting layer 129a of the light emitting structure 120a, thereby effectively improving the overall light emitting efficiency of the light-emitting device 100a, the light-emitting device 100b, the light-emitting device 100c and the light-emitting device 100d. Moreover, the coarse structure 130a, the coarse structure 130b1 and the coarse structure 130b2 or the annular coarse structures 130c and the annular coarse structures 130d of the embodiment are formed on the annular side surface 116 of the substrate 110, and thus light-emitting area of the light emitting structure 120a is not affected thereby.

Figure 5:
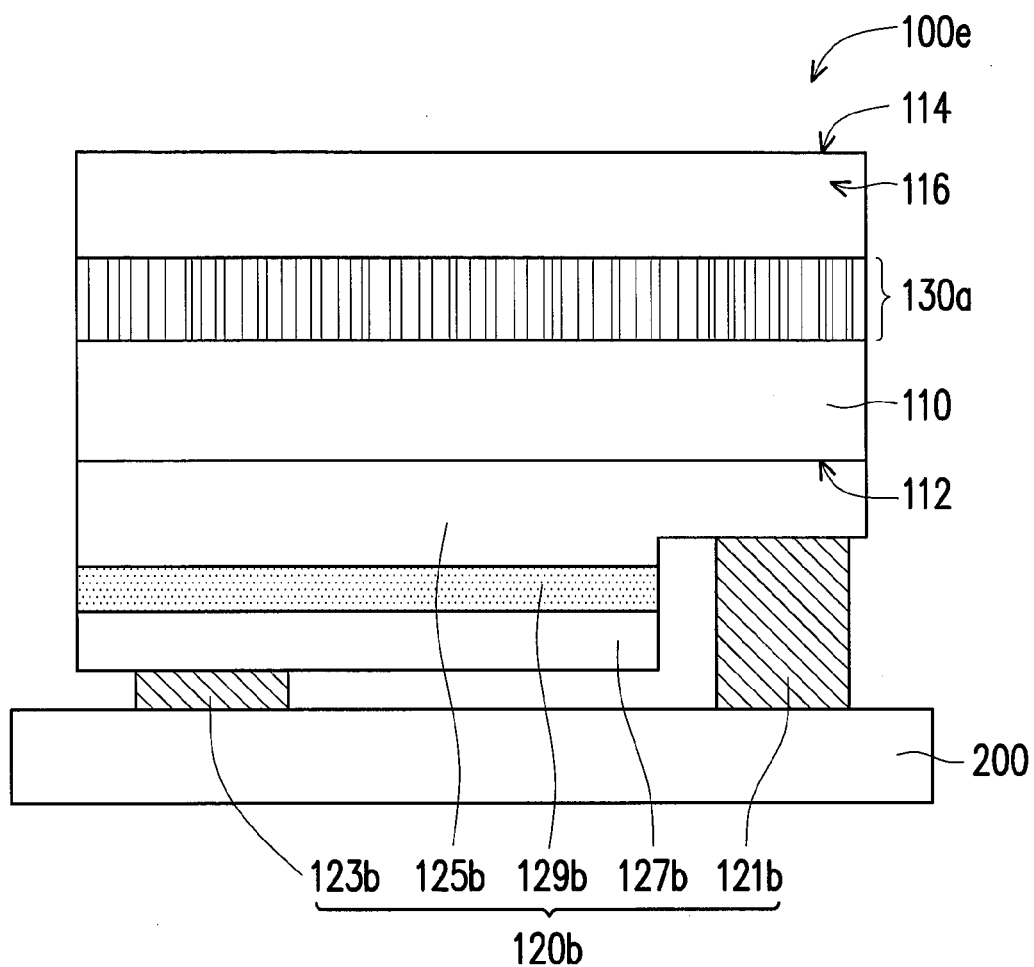
FIG. 5 is a schematic view illustrating a light-emitting device flip-chip bonded to a carrier of the invention.

FIG. 5 is a schematic view illustrating a light-emitting device flip-chip bonded to a carrier 200 of the invention. Referring to FIG. 5, a light-emitting device 100e of the embodiment is similar to the light-emitting device 100a of FIG. 1, while the main difference therebetween lies in that a first type semiconductor layer 125b, a light-emitting layer 129b and a second type semiconductor layer 127b of a light emitting structure 120b in the light-emitting device 100e are sequentially disposed on the upper surface 112 of the substrate 110, and a first electrode 121b and a second electrode 123b are respectively disposed on the first type semiconductor layer 125b and the second type semiconductor layer 127b. In particular, the light-emitting device 100e of the embodiment is flip-chip bonded to the carrier 200, and thus the embodiment is suitably used for packages of high power light-emitting devices. Since forward light emitted from the light-emitting layer 129b of the embodiment may pass through the substrate 110, the light can be scattered by the coarse structure 130a formed on the annular side surface 116 of the substrate 110 so as to increase forward light and lateral light emitted from the light-emitting device 100e.

As described above, since the coarse structure of the invention is formed on the annular side surface of the substrate, light can be scattered by the coarse structure to increase the light-emitting probability when the light emitted from the light-emitting layer of the light emitting structure. Therefore, the overall light-emitting amount of the light-emitting device is increased, thereby effectively improving the overall light emitting efficiency of the light-emitting device. In addition, since the coarse structure of the invention is formed on the annular side surface of the substrate, the light-emitting area of the light emitting structure is not affected thereby.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A light-emitting device, comprising:
a substrate having an upper surface and a lower surface opposite to each other and an annular side surface connecting the upper surface and the lower surface;
a light emitting structure disposed on the upper surface of the substrate; and
a coarse structure formed on the annular side surface of the substrate, wherein a ratio of a thickness of the substrate and a thickness of the coarse structure is greater than or equal to 1 and less than or equal to 20, a distance from a side of the coarse structure relatively near the upper surface of the substrate to the upper surface of the substrate is greater than or equal to 10 μm and less than or equal to 150 μm, and a distance from a side of the coarse structure relatively near the lower surface of the substrate to the lower surface of the substrate is greater than or equal to 0 μm and less than or equal to 100 μm.

2. The light-emitting device of claim 1, wherein the ratio of the thickness of the substrate and the thickness of the coarse structure is greater than or equal to 3 and less than or equal to 10.

3. The light-emitting device of claim 1, wherein the thickness of the coarse structure is greater than or equal to 10 μm and less than or equal to 50 μm.

4. The light-emitting device of claim 1, wherein the coarse structure is an annular coarse structure.

5. The light-emitting device of claim 4, wherein the annular coarse structure comprises an annular continuous coarse structure.

6. The light-emitting device of claim 1, wherein the coarse structure comprises a plurality of annular coarse structures.

7. The light-emitting device of claim 6, wherein the annular coarse structures are formed on the annular side surface of the substrate in different spacings.

8. The light-emitting device of claim 7, wherein a portion of the annular coarse structures overlap with each other.

9. The light-emitting device of claim 1, wherein the coarse structure is formed by a non-periodic pattern.

10. The light-emitting device of claim 1, wherein the light-emitting device is a flip chip light-emitting device.

11. The light-emitting device of claim 1, wherein the light emitting structure comprises a first electrode, a second electrode, a first type semiconductor layer, a second type semiconductor layer and a light-emitting layer, the light-emitting layer is located between the first type semiconductor layer and the second type semiconductor layer, and the first electrode and the second electrode are respectively disposed on the first type semiconductor layer and the second type semiconductor layer.

* * * * *

Disclaimer

8,872,202 B2 - Yi-Ru Huang; Jing-En Huang; Chih-Ling Wu; Yu-Yun Lo, all of Tainan (TW). LIGHT-EMITTING DEVICE CAPABLE OF IMPROVING THE LIIGHT-EMITTING EFFICIENCY. Patent dated October 28, 2014. Disclaimer filed April 18, 2022, by the inventors.

I hereby disclaim the following complete claims 1, 4-6 and 10-11 of said patent.

*(Official Gazette, March 14, 2023)*